(12) United States Patent
Wilson et al.

(10) Patent No.: US 12,062,407 B2
(45) Date of Patent: Aug. 13, 2024

(54) MEMORY DEVICE WITH REDUNDANCY FOR PAGE-BASED REPAIR

(71) Applicant: Micron Technology, Inc., Boise, ID (US)

(72) Inventors: Alan John Wilson, Boise, ID (US); Donald M. Morgan, Meridian, ID (US); John David Porter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 92 days.

(21) Appl. No.: 17/823,740

(22) Filed: Aug. 31, 2022

(65) Prior Publication Data

US 2024/0071558 A1 Feb. 29, 2024

(51) Int. Cl.
*G11C 29/54* (2006.01)
*G11C 29/00* (2006.01)

(52) U.S. Cl.
CPC .............. *G11C 29/76* (2013.01); *G11C 29/54* (2013.01); *G11C 29/808* (2013.01)

(58) Field of Classification Search
CPC ........ G11C 29/76; G11C 29/54; G11C 29/808
See application file for complete search history.

(56) References Cited

U.S. PATENT DOCUMENTS

| 5,848,009 A | * | 12/1998 | Lee | G11C 29/765 365/230.06 |
| 2006/0291303 A1 | * | 12/2006 | Kleveland | G11C 29/816 365/200 |
| 2013/0208548 A1 | * | 8/2013 | Hung | G11C 29/808 365/189.05 |

* cited by examiner

*Primary Examiner* — Mohammed A Bashar
(74) *Attorney, Agent, or Firm* — Schwegman Lundberg & Woessner, P.A.

(57) ABSTRACT

Apparatus and methods for page-based soft post package repair are disclosed. Based on data stored in a storage element, an address may be decoded to a prime row, a row-based redundant row, or a page-based redundant row. A match logic circuit may determine whether the address corresponds to a defective prime row and generate a match signal. A decoder can select a redundant row to be accessed instead of a prime row in response to the match signal indicating that the address data corresponding to the address to be accessed matches defective address data stored in a volatile memory. A page-based redundant row allows for page-by-page substitution for defective memory, allowing functional portions of memory to continue to be used.

20 Claims, 10 Drawing Sheets

MEMORY DEVICE WITH REDUNDANCY FOR PAGE-BASED REPAIR

Embodiments of the disclosure relate generally to memory devices and, more specifically, to memory devices with configurations of redundant rows facilitating improved page-based repair in the memory device.

BACKGROUND

Memory cells of memory devices such as dynamic random access memories (DRAMs), static RAMs (SRAMs), flash memories, or the like can experience defects leading to errors and/or failures. In some cases, memory cells can be identified as defective (hereinafter "defective memory cells") during the manufacturing process, including after the memory device (e.g., a memory chip) has been packaged, such as in cases where the memory cells were not defective before the packaging process. Examples of packaging include, but are not limited to, encapsulation by epoxy, ceramic packages, metal/glass packages, and the like. After a memory device has been packaged, the memory device can be tested to identify defective memory cells. Addresses mapped (e.g., assigned) to defective memory cells can be remapped (e.g., reassigned) to functional memory cells (e.g., memory cells that have not been identified as defective) so that the memory device can have the designed capacity, or at least improved capacity over the defective device.

The remapping can be performed using hardware modification. For example, by using antifuses, an address originally mapped to a first row can be remapped to a different row. An antifuse has a high resistance in its initial state. An antifuse can permanently create an electrically conductive path when a relatively high voltage is applied across the antifuse. An antifuse can have a structure similar to that of a capacitor, i.e., two conductive electrical terminals are separated by a dielectric layer. To create an electrically conductive path, a relatively high voltage is applied across the terminals, breaking down the interposed dielectric layer and forming a conductive link between the antifuse terminals. Creating a conductive path through an antifuse is referred to as "blowing an antifuse."

Certain protocols exist for performing post package repair. Post package repair can involve blowing antifuses. Blowing an antifuse can be performed in an antifuse programming time, which can be on the order of 200 milliseconds (ms). In some applications, such a delay can undesirably impact performance of a memory.

BRIEF DESCRIPTION OF THE SEVERAL VIEWS OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

To easily identify the discussion of any particular element or act, the most significant digit or digits in a reference number refer to the figure number in which that element is first introduced.

DETAILED DESCRIPTION

Figure 1:
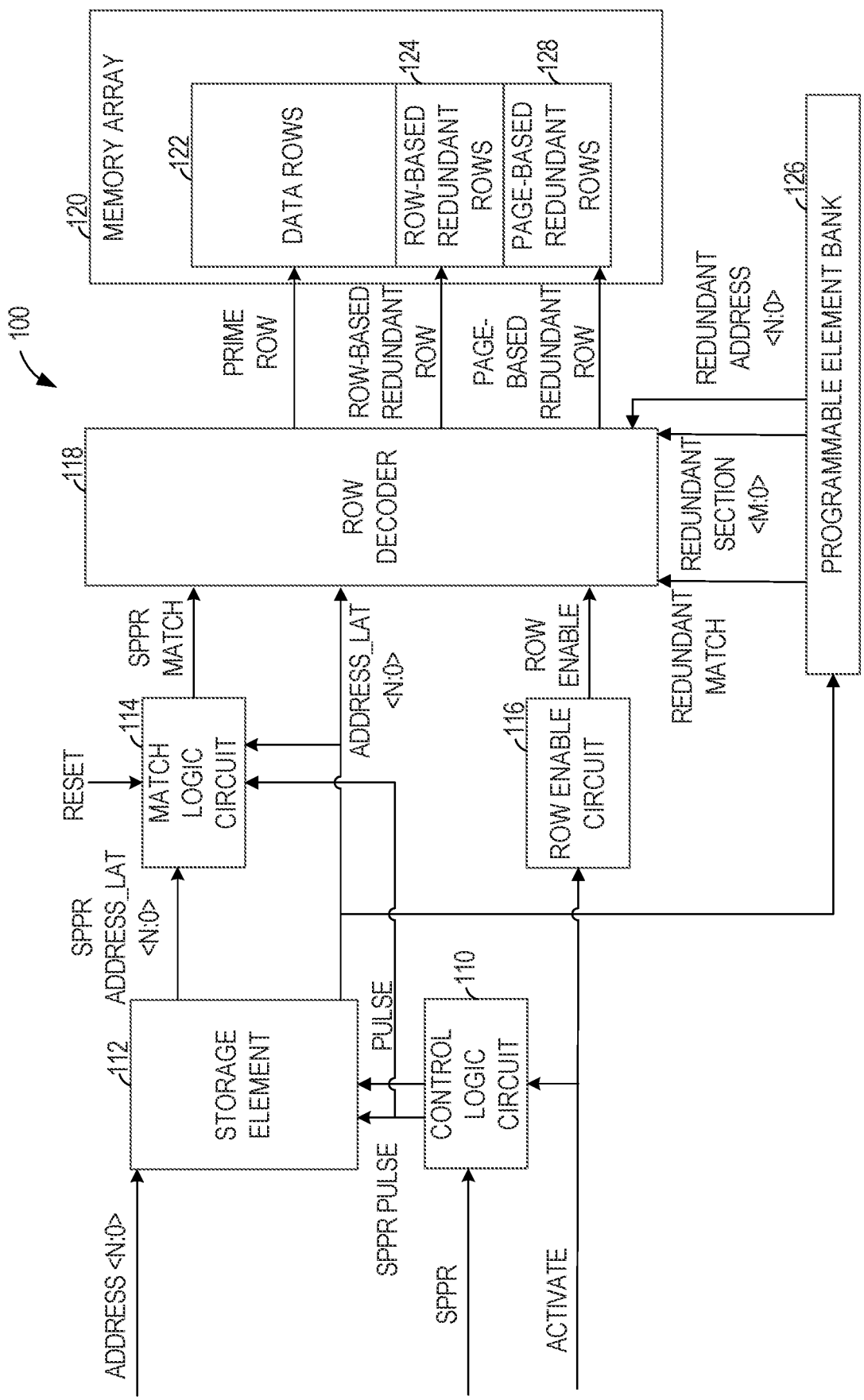
FIG. 1 is a block diagram illustrating a memory bank of a memory device configured to remap memory addresses using row-based repairs and page-based repairs, according to an embodiment.

After a memory device has been packaged, it is typically externally accessible only through nodes (e.g., contacts, pins, etc.) of the package, which can make repair of the memory device more difficult than prior to packaging. In addition, some defective memory cells might be identified (e.g., detected) after the memory device has been packaged and assembled into a larger unit, such as a dual-inline memory module (DIMM), flash memory card, smart phone, tablet computer, or the like. It is desirable to be able to repair memory devices after packaging, such as to improve overall yield and to reduce cost.

Memory devices may include groups (e.g., rows) of memory cells that can be used to replace defective groups (e.g., rows) of memory cells. In one such device, address data corresponding to a defective group of memory cells (hereinafter "defective address data") can be stored in programmable elements, such as volatile or non-volatile memory. The programmable elements can be used to remap the address of the defective group of memory cells to another group of memory cells (e.g., a group of "redundant" memory cells) that is functional. Address data corresponding to an address to be accessed can be latched in response to an Activate command. The device can then check if the latched address data matches the defective address data by comparing the latched address data with the defective address data. A row decoder, for example, can cause a selected row of memory cells to be activated to access data associated with the latched address data. The selected row can be a row of redundant memory cells when the latched address data matches the defective address data stored by the programmable elements.

SPPR features can repair defective memory cells post-packaging. Soft post package repair can refer to a non-persistent method of post package repair. In soft post package repair, defective address data can be stored in volatile memory of the memory device after the memory device is packaged. The defective address data can, for example, correspond to a group of memory cells that were identified as defective post packaging. In some cases, the group of memory cells identified as defective post packaging could be a group of redundant memory cells to which an address has been previously remapped. In such cases, other defective address data can already be stored in programmable elements, such as antifuses, so that memory cells associated with the other defective address data are not accessed. The defective address data can be stored as part of a power-up sequence of a memory device, for example. The defective address data can be stored in volatile memory until the memory device is powered down. A storage element comprising volatile memory, such as latches, registers, and/or flip-flops, can store the defective address data and a decoder can map the defective address to another group of memory cells. The other group of memory cells can be a group of redundant memory cells (e.g., a column or row of redundant memory cells) that are dedicated to soft post package repair. For instance, the defective address can be repeatedly mapped to the other group of memory cells.

Soft post package repair can be controlled by a controller that is external to the memory device. The controller can correspond to a memory controller, to test equipment, or the like. The controller can repair a packaged memory device by providing signals to nodes of the packaged memory device, in which defective address data is stored in a volatile manner. For example, the controller can provide signals on pre-existing Activate, Data Write, Data, and/or like nodes of a packaged DRAM device. In certain embodiments, the controller can redundantly store the defective address data in non-volatile memory stored outside of the packaged memory device that is being repaired for future retrieval. According to an embodiment, an apparatus can include a first memory device and a second memory device and the controller can be configured to retrieve defective address data from non-volatile memory of the second memory device and provide the retrieved defective address data to the first memory device. The first and second memory devices can be included in a packaged unit, such as a dual inline memory module or a memory card.

In an embodiment, soft post package repair can repair a memory device by remapping a defective address that had been previously remapped to a defective group of redundant memory cells. For example, a group of redundant memory cells to which an address has already been remapped could itself become defective post packaging. In one such embodiment, the defective address can be remapped to a different group of redundant memory cells.

A memory device that can perform soft post package repair can include memory cells in a package, volatile memory configured to store defective address data in response to entering a soft post-package repair mode, a match logic circuit, and a decoder. The match logic circuit can generate a match signal indicating whether address data corresponding to an address of the memory cells to be accessed matches the defective address data stored in the volatile memory. The decoder can select a first group of the memory cells to be accessed instead of a second group of the memory cells in response to the match signal indicating that the address data corresponding to the address to be accessed matches the defective address data stored in the volatile memory. The second group of the memory cells can correspond to a replacement address associated with other defective address data stored in non-volatile memory of the apparatus.

In the context of this document, a group of commonly coupled memory cells in a first general direction can correspond to, for example, a "row" of memory cells (which is also sometimes referred to herein as a "row of memory"). While a group of commonly coupled memory cells in another direction, typically a perpendicular direction can correspond to a "column" of memory cells. Repairing a row of memory can refer to, for example, reassigning the address previously assigned to a defective row of memory to another row of memory. "Programming," "enabling," and "disabling" a redundant row can mean, for example, programming, enabling, or disabling a group of redundant memory cells. A logic signal name ending with a trailing "F" can denote an active-low signal. However, it will be appreciated that the various embodiments of this document can include alternative active-high and/or active-low logic signals or logically equivalent circuits.

Within a group of cells (e.g., a row or column of memory cells), subgroups may be referred to as a "page" of cells, such that each group comprises multiple pages. The soft post package repair may be performed at the group or page level, such that one entry stored in the non-volatile memory of the apparatus may indicate that a defective address is for an entire group of memory cells and another entry stored in the non-volatile memory of the apparatus may indicate that a defective address is for a single page of memory cells. In some example embodiments, each group of cells comprises the same number of pages of cells.

In some memory devices, data in an entire row is available for access in a single activate cycle. Thus, a single read request may be responded to with a single response comprising all of the data in a row identified by an address included in the read request. In other memory devices, less than all data in a row is available for access in a single activate cycle. The data that is available for access in a single activate cycle is referred to herein as a "page." Accordingly, for some memory devices, each row includes a single page while in other memory devices, each row includes multiple pages. As discussed above, the row size is determined by the physical layout of the memory components (i.e., the number of commonly addressable memory cells in a first general direction). The page size may be determined by other design constraints (e.g., the number of connection pins on a memory sub-system, which may be lower than the row size).

The memory device may comprise prime rows and redundant rows. Initially, each prime row is associated with one or more unique memory addresses of the manufactured memory, and the redundant rows are unused. Accordingly, a memory access command that identifies a memory address will (initially) access a prime row. When defects in prime rows are detected, the defective pages or rows are retired from service and a redundant row is used in its place. Thus, the entire address range of the memory device may continue to be used even though a prime row associated with an address has become defective, extending the useful life of the memory device.

The redundant rows of the memory device may be pre-allocated (e.g., before or when the device is fabricated) as row-based redundant rows or page-based redundant rows. Alternatively, the redundant rows may be configurable as row-based or page-based redundant rows post packaging. Row-based redundant rows and page-based redundant rows may be physically identical but used differently for post-package repair. A row-based redundant row is used in place of an entire prime row. Each page of a page-based redundant row may be used in place of an individual page of a prime row. Row-based redundant rows may be used on a row-by-row basis or to repair multiple rows at a time.

Thus, when a single page of a prime row becomes defective, a page of a page-based redundant row may be used in place of the defective page while the remainder of the prime row continues to be used. By contrast, when a single page of a prime row becomes defective, the entirety of a row-based redundant row may be used in place of the entirety of the prime row, causing the non-defective portions of the prime row to cease being used. Additionally, compared with solutions using page-based redundant rows, either more row-based redundant rows are allocated or fewer page defects can be repaired using the same number of redundant rows. For example, if there are eight pages per row, a single page-based redundant row can be used to substitute pages for eight defective pages but eight row-based redundant rows would be used when the eight defective pages are in different prime rows.

The waste of non-defective data is increased when the row-based redundant rows are used to perform multiple-row repairs in which a single repair affects multiple (e.g., two, four, or eight) prime rows. By comparison with solutions using single-row repairs, multiple-row repairs reduce the number of address bits used to determine if a redundant row is being used and what the address of the redundant row is, but a single defective page in a single prime row can cause multiple non-defective rows to stop being used. Accordingly, compared with solutions using page-based redundant rows or single-row-based redundant rows, either more multiple-row-based redundant rows are allocated or fewer page defects can be repaired.

In some example embodiments, multiple-row-based redundant rows are used to repair defective pages or rows identified during the manufacturing process and a combination of single-row-based redundant rows and page-based redundant rows used to repair defective pages or rows identified after fabrication is complete.

FIG. 1 is a block diagram illustrating a memory bank of a memory device 100 configured to remap memory addresses using row-based repairs and page-based repairs, according to an embodiment. The illustrated memory device 100 includes a control logic circuit 110, a storage element 112, a match logic circuit 114, a row enable circuit 116, a row decoder 118, a memory array 120 comprising data rows 122, row-based redundant rows 124, and page-based redundant rows 128, and a programmable element bank 126. The memory device 100 can include a mode register, and a soft post package repair mode can be entered in response to a change in a value stored in the mode register. The memory device 100 can include more or fewer elements than illustrated in FIG. 1.

The control logic circuit 110 can receive a soft post package repair signal SPPR and an activate signal Activate as inputs and generate a pulse signal Pulse and a soft post package repair pulse SPPR Pulse. Both of these pulse signals can be asserted for a sufficient amount of time for volatile memory elements, such as latches, registers, SRAM, or the like, to capture data. Then the control logic circuit 110 can de-assert these pulse signals after the data has been captured. The soft post package repair signal SPPR can be asserted to enter a soft post package repair mode of operation. When the memory device 100 is operating in the soft post package repair mode, the activate signal Activate can be asserted when defective address data is provided to the memory device 100. The control logic circuit 110 can assert the soft post package repair pulse SPPR Pulse in response to the activate signal Activate being asserted when the memory device 100 operates in the soft post package repair mode. The control logic circuit 110 can assert the pulse signal Pulse in response to the activate signal Activate being asserted when the memory device 100 operates in a mode of operation other than the soft post package repair mode.

The storage element 112 can receive address data Address[N:O] and store the address data Address[N:O] in volatile memory elements. The storage element 112 can comprise any suitable volatile memory elements (e.g., SRAM) to store the address data Address[N:O]. The storage element 112 can include a first group of memory elements and a second group of memory elements. These groups of memory elements can be logically separate from each other. In some instances, these groups of memory elements can also be physically separate from each other. The first group of memory elements can store defective address data. The address data Address[N:O] can be stored in the first group of memory elements as defective address data when the soft post package repair pulse signal SPPR Pulse is asserted. The second group of memory elements can store address data corresponding to an address of the memory array 120 to be accessed (e.g., read or programmed). The address data Address[N:O] can be stored in the second group of memory elements when the pulse signal Pulse is asserted.

The match logic circuit 114 can compare address data from the first group of memory elements SPPR Addr_Lat [N:O] with address data from the second group of memory elements Addr_Lat[N:O]. The match logic circuit 114 can generate the soft post package repair match signal SPPR Match in response to (e.g., based at least in part on) the comparison. The soft post package repair match signal SPPR Match can be asserted to indicate that the address to be accessed in the memory array 120 matches a defective address stored in the storage element 112. When the address to be accessed does not match a defective address stored in the storage element, the soft post package repair match signal SPPR Match can be de-asserted. The match logic circuit can also de-assert the soft post package repair match signal SPPR Match in response to a reset signal Reset.

The row enable circuit 116 can include circuitry configured to control activating a row of the memory array 120. The row enable circuit 116 can receive the activate signal Activate and provide a row enable signal Row Enable to the row decoder 118. The row enable circuit 116 can provide a delay in enabling the row decoder 118 after the activate signal Activate is asserted. This can enable the row decoder 118 to select a row of the memory array 120 when address data and match signals are ready to provide a selected row address of the memory array 120. The selected row address can be an address remapped to a redundant row of the row-based redundant rows 124 to repair a defective data row of the data rows 122 or a defective redundant row of the row-based redundant rows 124. The selected row address may also be an address remapped to a redundant row of the page-based redundant rows 128 to repair a defective data row of the data rows 122 or a defective redundant row of the row-based redundant rows 124. Each of the row-based redundant rows 124, when in use, is used in place of an entire row of the data rows 122. By contrast, the page-based redundant rows 128 are used a page at a time. Thus, a page-based redundant row 128 may be selected by the row decoder 118 based not only on the row identified by the address, but by the page as well.

The row decoder 118 can decode the address to be accessed to select a row of memory cells in the memory array 120 to which the address to be accessed is mapped. The selected row can be a data row of the data rows 122 when the address to be accessed is not known to be defective. For example, when the row enable signal Row Enable is asserted and the address to be accessed does not match a defective address stored in either storage element 112 or programmable element bank 126, a prime row signal Prime Row can be asserted to activate a row of the data rows 122 mapped to the address to be accessed as the selected row.

The row decoder 118 can prevent a defective row from being activated in response to the soft post package repair match signal SPPR Match from the match logic circuit 114 and/or a redundant match signal Redundant Match from the programmable element bank 126.

When the address to be accessed matches a defective address stored in the storage element 112 and/or a defective address stored in the programmable element bank 126, the programmable element bank 126 identifies the address of the redundant row to be used in place of the defective row. In response to the redundant match signal, the row decoder 118 decodes the redundant address instead of the latched address. The row decoder 118 can decode the address to be accessed to select a redundant row of the row-based redundant rows 124 or the page-based redundant rows 128. A redundant row signal Row-Based Redundant Row can be asserted to activate a row of the row-based redundant rows 124 mapped to the address to be accessed as the selected row. In response to the soft post package repair match signal SPPR Match being asserted, a different row of the row-based redundant rows 124 can be activated instead of a row of the row-based redundant rows 124 that would have been activated if only the redundant match signal Redundant Match had been asserted. Alternatively, a redundant row signal Page-Based Redundant Row can be asserted to activate a row of the page-based redundant rows 128 mapped to the address to be accessed as the selected row.

For example, in response to the redundant match signal Redundant Match being asserted, the row decoder 118 can decode redundant row address data Redundant Section <M:O>, provided by the programmable element bank 126 as corresponding to the address to be accessed, to select a redundant row of the row-based redundant rows 124 to which a defective address has been originally remapped. In response to the soft post package repair match signal SPPR Match indicating that the address to be accessed matches a defective address stored in the storage element 112, the row decoder 118 can select a different redundant row of the row-based redundant rows 124 instead, such as in a case where the redundant row to which the defective address had been originally remapped has later been identified as defective. Accordingly, storing the defective address data in the storage element 112 can be used to prevent a defective row of the row-based redundant rows 124 from being selected.

The memory array 120 can include volatile or nonvolatile memory cells. Some examples of memory cells that can be implemented in the memory array 120 include DRAM cells, SRAM cells, flash memory cells, such as NAND flash memory cells, phase change memory cells, ferroelectric random access memory (FeRAM), and the like; and the memory array may include hybrid memory devices implementing including multiple memory technologies The programmable element bank 126 can store defective address data in the memory array 120 using programmable elements. The programmable element bank 126 can compare address data corresponding to an address to be accessed Address_Lat <N:0> with the defective address data stored by the programmable elements to determine whether the address to be accessed corresponds to a defective address of the array 120. The programmable element bank 126 can generate a redundant match signal indicative of whether the address to be accessed matches a defective address of the memory array 120. The programmable element bank 126 can provide redundant address data Redundant Address <N:0> and Redundant Section <M:0> used to select a row of the row-based redundant rows 124 or the page-based redundant rows 128 to which the defective address has been remapped.

FIG. 1 illustrates one bank of a memory device 100. In certain embodiments, some or all of the circuits illustrated in FIG. 1 can be replicated in two or more banks of the memory device 100. Accordingly, the soft post package repair described with reference to FIG. 1 can be a per bank solution. In one embodiment, multiple banks of the memory device 100 can simultaneously perform soft post package repair. Alternatively or additionally, two or more banks of the memory device 100 can sequentially perform soft post package repair.

Figure 2:
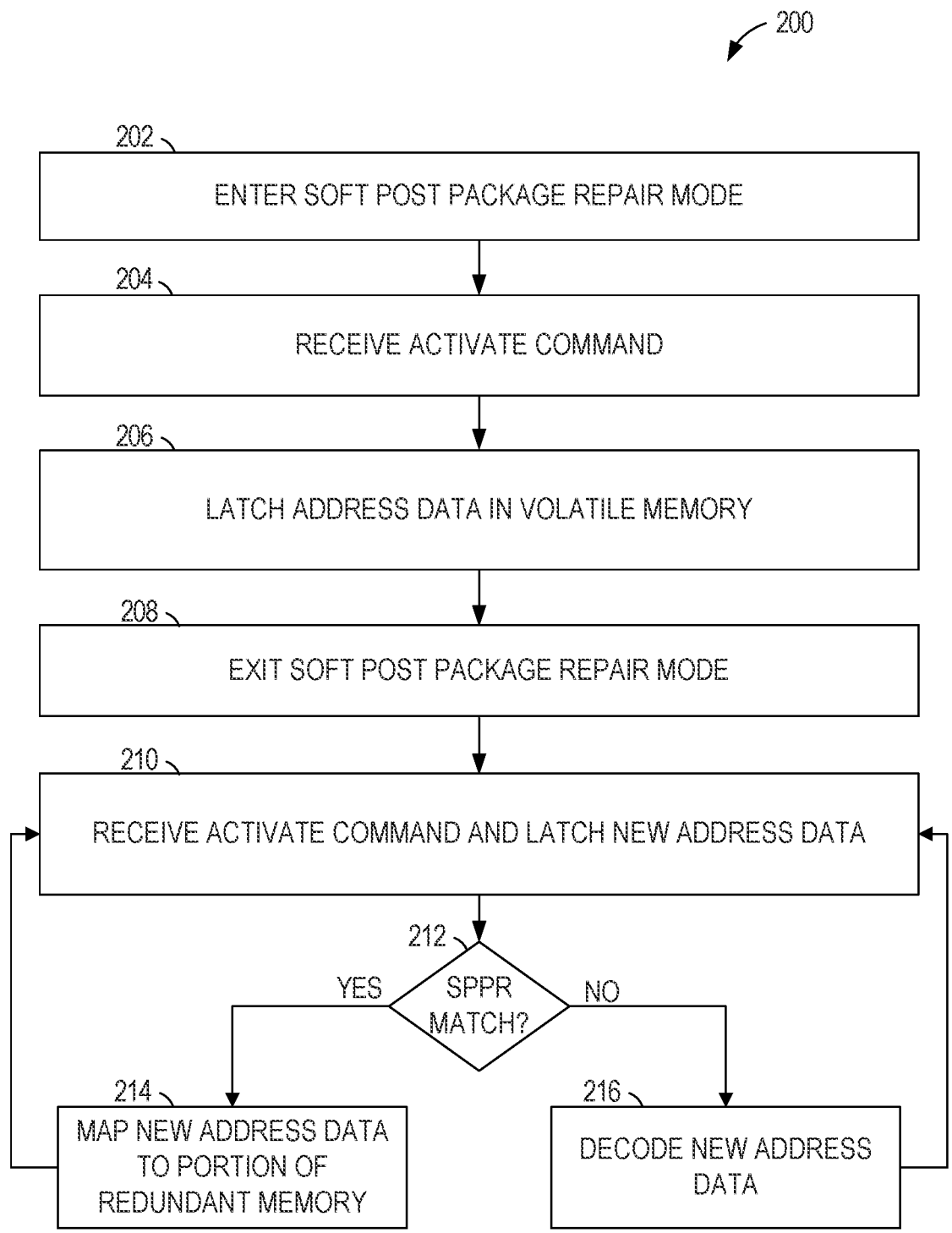
FIG. 2 is a flow chart showing operations of a method performed by a circuit in remapping memory address, according to an embodiment.

FIG. 2 is a flow chart showing operations of a method 200 performed by a circuit in remapping memory addresses, according to an embodiment. The method 200 can be implemented by the memory device 100 of FIG. 1, for example. Any combination of the features of the method 200 can be embodied in code stored in a non-transitory computer-readable storage. When executed, the non-transitory computer-readable storage can cause some or all of any of the method 200 to be performed. It will be understood that any of the methods discussed herein may include greater or fewer operations and that the operations may be performed in any order, as appropriate.

The method 200 can perform soft post package repair. In one embodiment, the method 200 is performed as part of a power-up sequence of a memory device and/or in response to an instruction received from a device outside the package, such as from a memory controller or from test equipment. At block 202, the soft post package repair mode can be entered. The soft post package repair mode can be entered in response to receiving a soft post package repair command at an externally accessible node of a package of a memory device, such as the memory device 100. Prior to entering the soft post package repair mode, operations of other post package repair modes can be performed.

While operating in the soft post package repair mode, an activate command can be received at block 204. The activate command can be followed by a precharge. Defective address data can be provided with the activate command. The defective address might be currently mapped to a group of "regular" memory cells or might have already been remapped to a group of redundant memory cells. The defective address data can be stored in volatile memory of a storage element, such as a latch or a register, at block 206. After the defective address data is stored, the next one of multiple latch signals will toggle to accept the address presented into the next unused SPPR page storage latch. Thus, more than one defective address can be stored in the storage element during the soft post package repair mode such that multiple defective portions of the memory array can be repaired by soft post package repair. After the defective address data is stored in the storage element, soft post package repair mode can be exited at block 208.

During operation of the memory device, memory access operations can be performed in response to inputs received at one or more externally accessible nodes of the package of the memory device. The memory access operations can include read operations and/or programming (write) operations. As part of the memory access operations, an activate command can be received. The activate command can be received with an address to be accessed at block 210. The address data corresponding to the address to be accessed can also be stored in volatile memory of a storage element at block 210.

The address to be accessed can be compared to the defective address (e.g., multiple defective addresses) to determine whether there is a soft post package repair match at block 212. When the address to be accessed matches a defective address stored in the storage element, a soft post package repair match is present. The defective address can be remapped to a group of functional memory cells of the memory array at block 214. A decoder can perform such remapping. The decoder can also override a replacement address associated with other defective address data previously stored in non-volatile memory, in which the replacement address corresponds to a different (e.g., now defective) group of memory cells that were previously mapped to the address to be accessed. The replacement address can be mapped to a location of the non-volatile memory that stores the other defective address data. For instance, replacement address data can be generated by a decoder based on the location of the non-volatile memory that stores the other defective address data. Alternatively, the replacement address can be stored in the non-volatile memory. The process can then continue at block 210.

On the other hand, when the address to be accessed does not match a defective address stored in the storage element at block 212, a soft post package repair match is not present. In that case, the address to be accessed can be decoded by a decoder at block 216. The decoder can select a group of memory cells of the memory array mapped to the address to be accessed. The selected group of memory cells of the memory array can be either a group of regular memory cells or a group of redundant memory cells of the memory array. The process can then continue at block 210.

Figure 3:
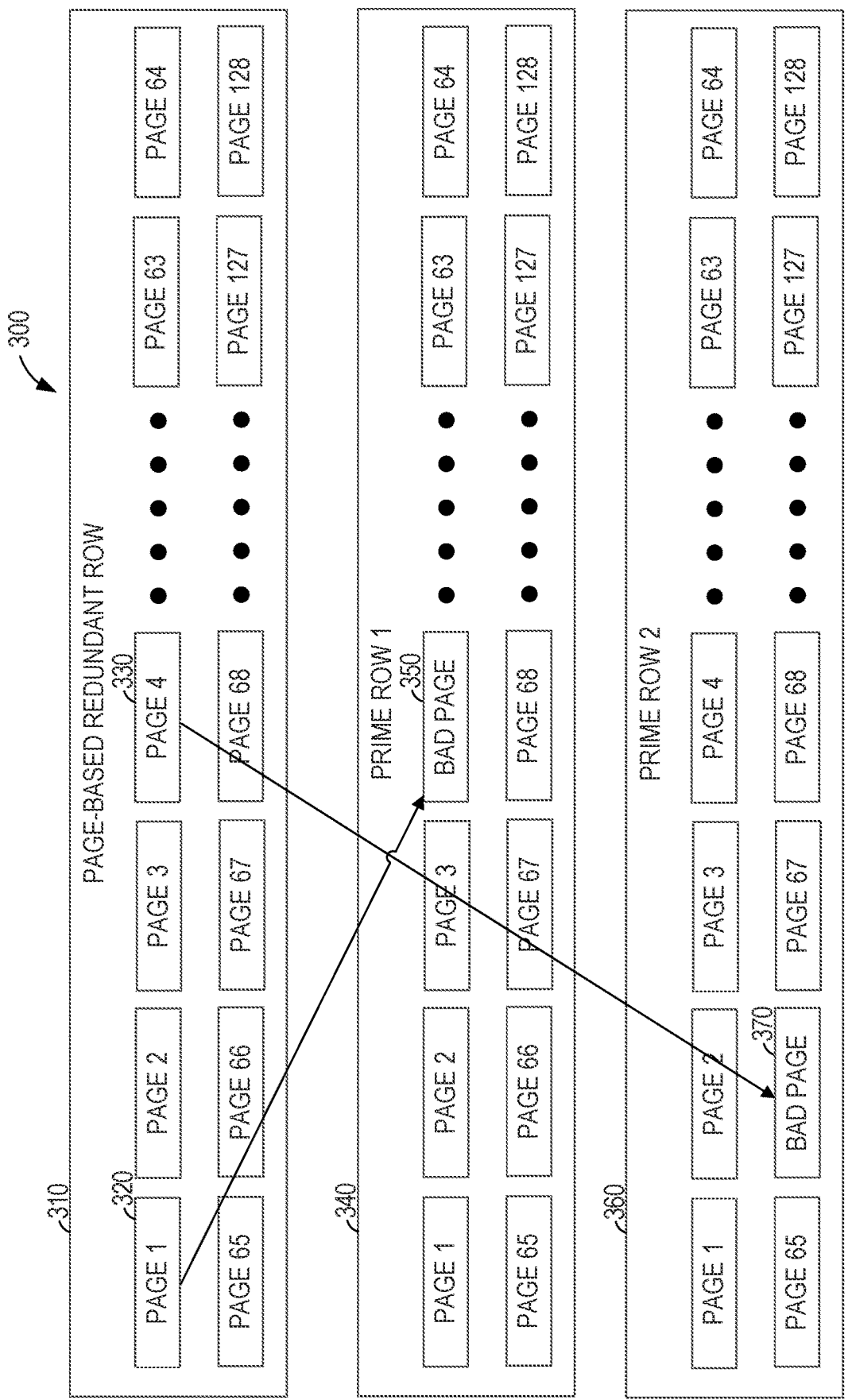
FIG. 3 is a block diagram illustrating page-based repairs, according to an embodiment.

FIG. 3 is a block diagram 300 illustrating page-based repairs, according to an embodiment. Page-based redundant row 310 comprises 128 pages of memory (e.g., FeRAM) that can be individually used in place of bad pages in prime rows. In this example, each row is 8192 bits and each page is 64 bits. Among the 128 pages of memory are pages 320 and 330 (indicated as Page 1 and Page 4 in FIG. 3). Prime row 340 has 127 good pages as well as bad page 350. Prime row 360 has 127 good pages as well as bad page 370.

The address of bad pages 350 and 360 are stored so that when a memory access request is received that includes an address corresponding to a bad page, the memory of a page of the page-based redundant row 310 is accessed instead. In the example of FIG. 3, the page 320 is accessed instead of the bad page 350 and the page 330 is accessed instead of the bad page 370.

By contrast, in a row-based repair, an entire redundant row would be used in place of each of the prime rows 340 and 360. This would waste the 127 good pages in each of the prime rows 340 and 360, which would cease being used just because a single page went bad. Furthermore, instead of using one page-based redundant row to repair pages in up to 128 different prime rows, two row-based redundant rows would be used just to repair the two bad pages shown in FIG. 3.

Figure 4:
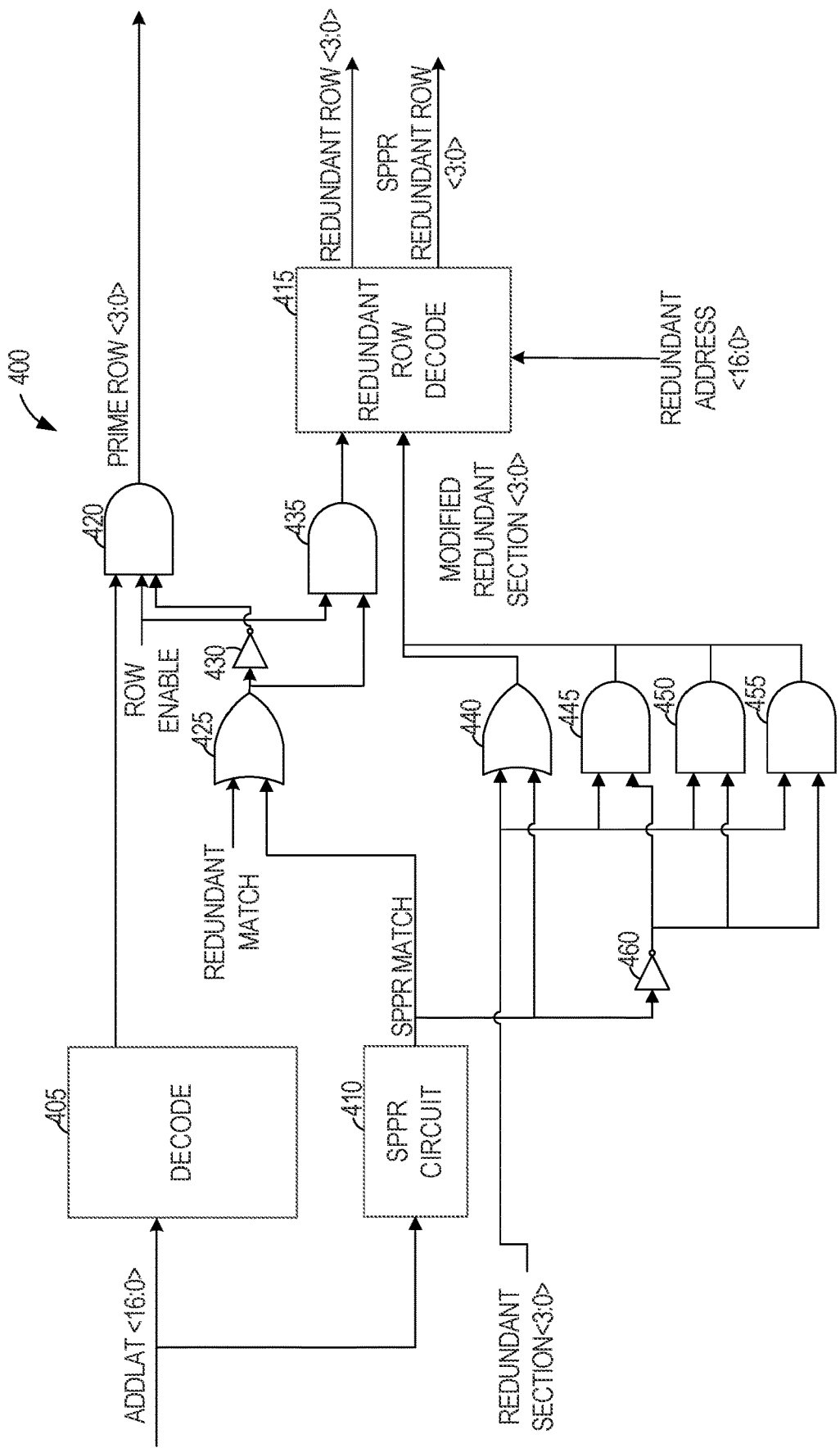
FIG. 4 is a block diagram illustrating an example row decoder, according to an embodiment.

FIG. 4 is a block diagram illustrating an example row decoder 400, according to an embodiment. The row decoder 400 includes an address decoder 405, an SPPR circuit 410, a redundant row decoder 415, AND gates 420, 435, 445, 450, and 455, OR gates 425 and 440, and NOT gates 430 and 460. The row decoder 400 receives an address (AddLat<16:0>), a row enable, a redundant section (Redundant Section<3:0>), a redundant address (Redundant Address <16:0>) and a Redundant Match as inputs and generates an output for each row in a memory array. The output for a row is set when the row is being accessed and cleared otherwise. Thus, the row decoder 400 may be configured to accept a multi-bit address (e.g., a 17-bit address) and decode the address to identify a single row of the memory array. With reference to FIG. 1, the row decoder 118 may receive the address from the storage element 112, the row enable from the row enable circuit 116, and the Redundant Match, the redundant section, and the redundant address from the programmable element bank 126. The outputs may be provided to the memory array 120.

The address decoder 405 receives the address input and generates multiple outputs, one for each prime row. One of the outputs is set, indicating that the corresponding prime row is the row for the input address. The remaining outputs are cleared, indicating that the corresponding prime row is not being accessed. The output for each prime row may be implemented using multiple lines, one for each page of the prime row. In the example of FIG. 4, four pages per row are used. Accordingly, four outputs (shown as a four-bit value, <3:0>) are provided for each prime row. Only one output is set, indicating the specific page of the specific row to be accessed.

The AND gate 420 is replicated for each output of the address decoder 405. For all prime rows that do not correspond to the input address, the input to the AND gate 420 from the address decoder 405 is cleared, so the output from the AND gate 420 is also cleared, and the corresponding prime row is not accessed. For the prime row that corresponds to the input address, the prime row is selected, the row enable input is set, and the output of the NOT gate 430 is set. The output of the NOT gate 430 is set if and only if the SPPR Match signal and the Redundant Match signal are both cleared. Thus, if either a Redundant Match or SPPR Match is found, no prime row will be selected, and when neither a Redundant Match nor an SPPR Match is found, the prime row determined by the address decoder 405 will be selected.

The SPPR circuit 410 determines whether the input address is for an SPPR. If so, the SPPR circuit 410 indicates this by setting the SPPR Match output. Otherwise, the SPPR Match output is cleared.

Each bit of the redundant section input is provided to a different one of the logic gates 440-455. Each of the logic gates 440-455 takes SPPR Match or its inverse as the second input. Combined, the logic gates 440-455 generate a modified redundant section output that is provided to the redundant row decoder 415.

If there is a redundant match or an SPPR match, the output of the OR gate 425 is set. If the row enable input is also set, the output of the AND gate 435 is set, enabling the redundant row decoder 415. When enabled, based on the modified redundant section and the redundant address, the redundant row decoder 415 indicates whether a redundant row or SPPR redundant row should be used and selects the row. When disabled, the redundant row decoder 415 indicates that no redundant row should be used.

If the address decoder 405 determines that the input address is valid, the row enable signal is received, and there is neither a redundant match nor an SPPR match (causing the output of the OR gate 425 to be cleared and the output of the NOT gate 430 to be set) and the output of the AND gate 420 is set, indicating that a prime row should be used.

Figure 5:
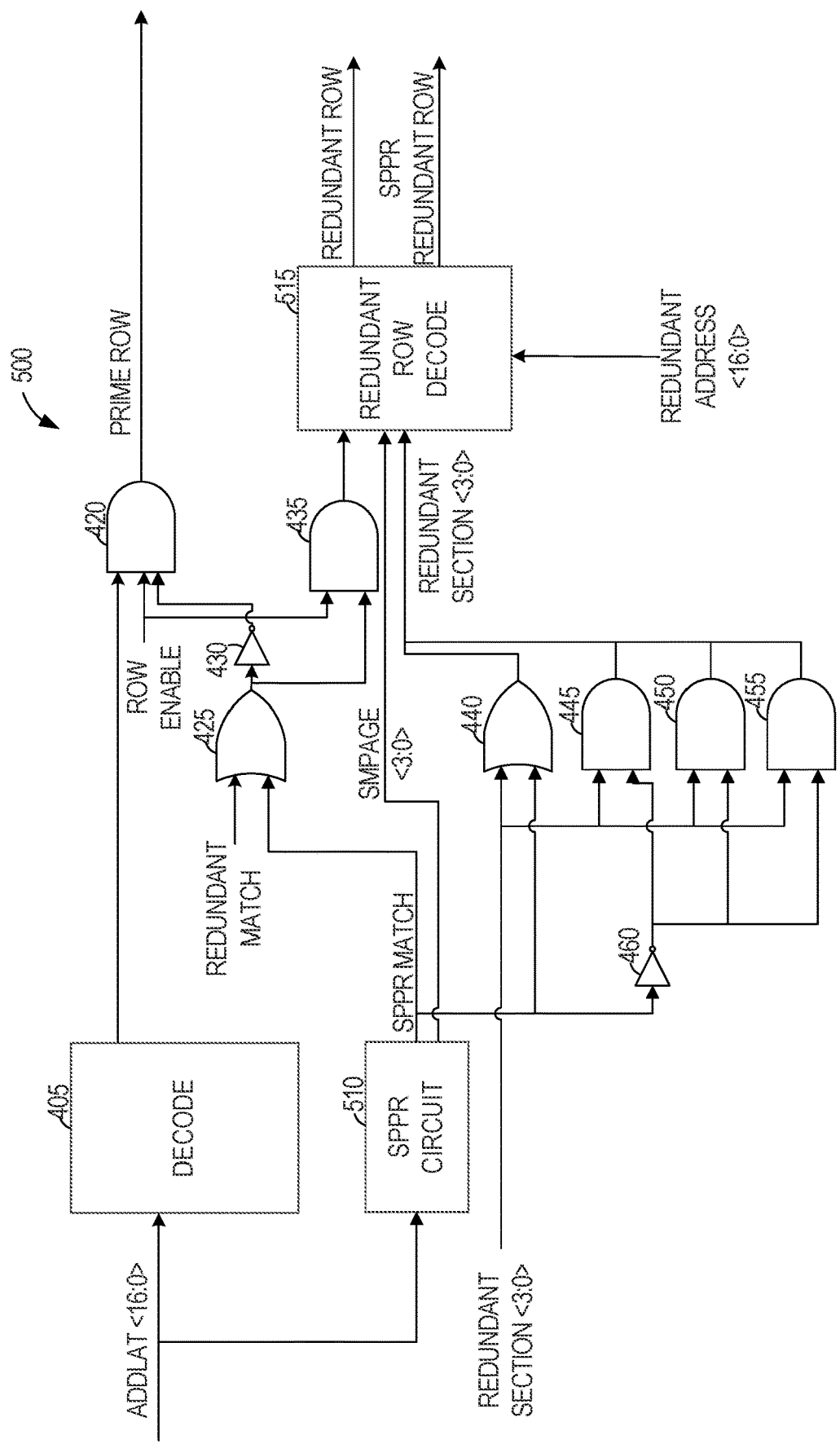
FIG. 5 is a block diagram illustrating an example row decoder, according to an embodiment.

FIG. 5 is a block diagram illustrating an example row decoder 500, according to an embodiment. The row decoder 500 includes the address decoder 405, an SPPR circuit 510, a redundant row decoder 515, AND gates 420, 435, 445, 450, and 455, OR gates 425 and 440, and NOT gates 430 and 460. The row decoder 500 receives an address (AddLat<16:0>), a row enable, a redundant section (Redundant Section <3:0>), a redundant address (Redundant Address <16:0>) and a Redundant Match as inputs and generates a prime row selection, a redundant row selection, and an SPPR redundant row selection as outputs. With reference to FIG. 1, the row decoder 118 may receive the address from the storage element 112, the row enable from the row enable circuit 116, and the Redundant Match, the redundant section, and the redundant address from the programmable element bank 126. The outputs may be provided to the memory array 120.

The address decoder 405, the AND gates 420, 435, 445, 450, and 455, the OR gates 425 and 440, and the NOT gates 430 and 460 operate as discussed above with respect to FIG. 4. The SPPR circuit 510 is modified from the SPPR circuit 410 to include an SMPage <3:0> output. The SMPage <3:0> output allows for selection of an individual page of the selected row.

Thus, redundant row decoder 515 is enabled to select a row based on the redundant address and a page of the row based on the SMPage <3:0> input. By contrast, the redundant row decoder 415 of FIG. 4 does not receive an SMPage <3:0> input and thus selects the page only based on the redundant address.

Figure 6:
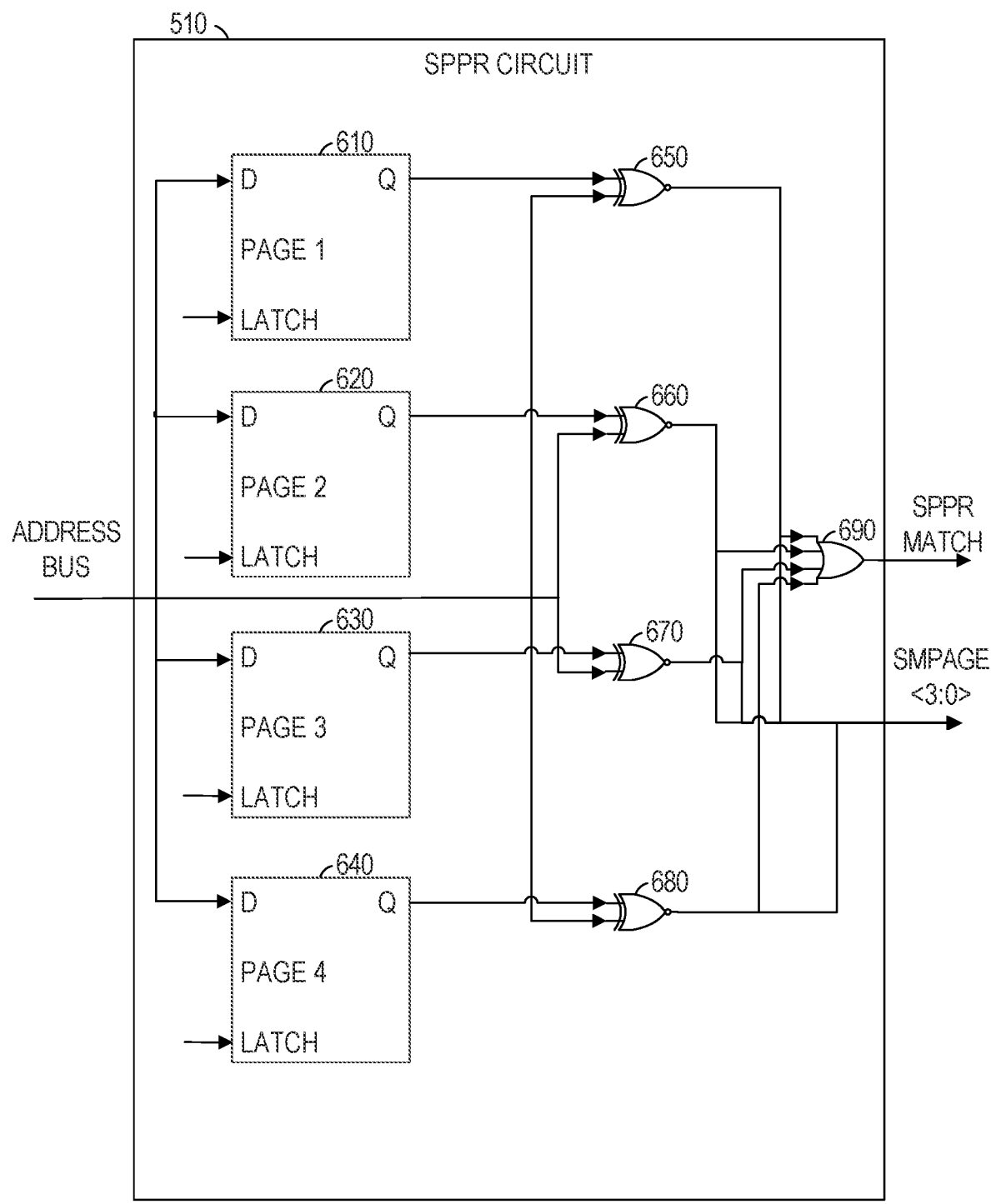
FIG. 6 is a block diagram illustrating a soft post-package repair (SPPR) circuit, according to an embodiment.

FIG. 6 is a block diagram illustrating the SPPR circuit 510, according to an embodiment. The SPPR circuit 510 receives an address via an address bus as an input and generates an SPPR Match signal and an SMPage signal as outputs. The input address is an address for memory to be accessed. The SPPR Match output is set if the prime row for the address should be ignored and a redundant row used instead. In that case, the SMPage signal indicates which page of the redundant row (e.g., a redundant row identified by the redundant address input to the redundant row decoder 515 of FIG. 5) is to be used.

The SPPR circuit 510 comprises latches 610, 620, 630, and 640, XNOR gates 650, 660, 670, and 680, and OR gate 690. The latches 610-640 store data that indicates whether, for an input address, a particular page has been repaired. For example, the address bus may provide a 17-bit address. The high 15 bits of the address may identify a row in a memory and the low 2 bits may select from among four pages in each row. Each of the latches 610-640 represents a number of latches equal to the size of the address (e.g., 17 latches for a memory using 17-bit addresses). Similarly, each of the XNOR gates 650-680 represents a number of XNOR gates equal to the size of the address. An XNOR gate outputs a 1 when the two inputs are the same and a 0 if they are different. Thus, an XNOR gate that receives one bit of a stored address and one bit of an input address will output a 1 if the bits match. The outputs of the multiple XNOR gates are ANDed together to generate a 1-bit output that indicates whether the input address matches the latched address. In the example of FIG. 5, latches are available to store four addresses, allowing for four any-to-any soft page repairs. In other example embodiments, more or fewer any-to-any soft page repairs may be available, and a corresponding number of latches are used.

The 17 bits of the address may be provided as inputs to each of the latches 610-640. Each latch determines if the corresponding row has been repaired for a specific page (e.g., latch 610 for page 0, latch 620 for page 1, latch 630 for page 2, latch 640 for page 3). Thus, for any given address, the signal shown from the address bus to the XNOR gates 650-680 is compared to latched repair addresses from latches 610-640 by XNOR gates 650-680 to determine if there is a match.

When the output of one of the XNOR gates 650-680 is set, this indicates that the corresponding page is being used for an SPPR repair. The outputs of the XNOR gates 650-680, together, are the SMPage <3:0> output, indicating which page is selected for the SPPR repair. If any bits of the SMPage <3:0> output are set, the OR gate 690 causes the SPPR Match output to be set.

To record an address in one of the latches 610-640, a latch signal is provided to the SPPR circuit 510 at the same time an address is provided. The SPPR circuit 510 modifies which of the latches 610-640 is coupled to the latch signal after each time one of the latches 610-640 stores an address. Thus, the latched addresses are recorded in a particular one of the latches 610-640 without being recorded in the others.

Figure 7:
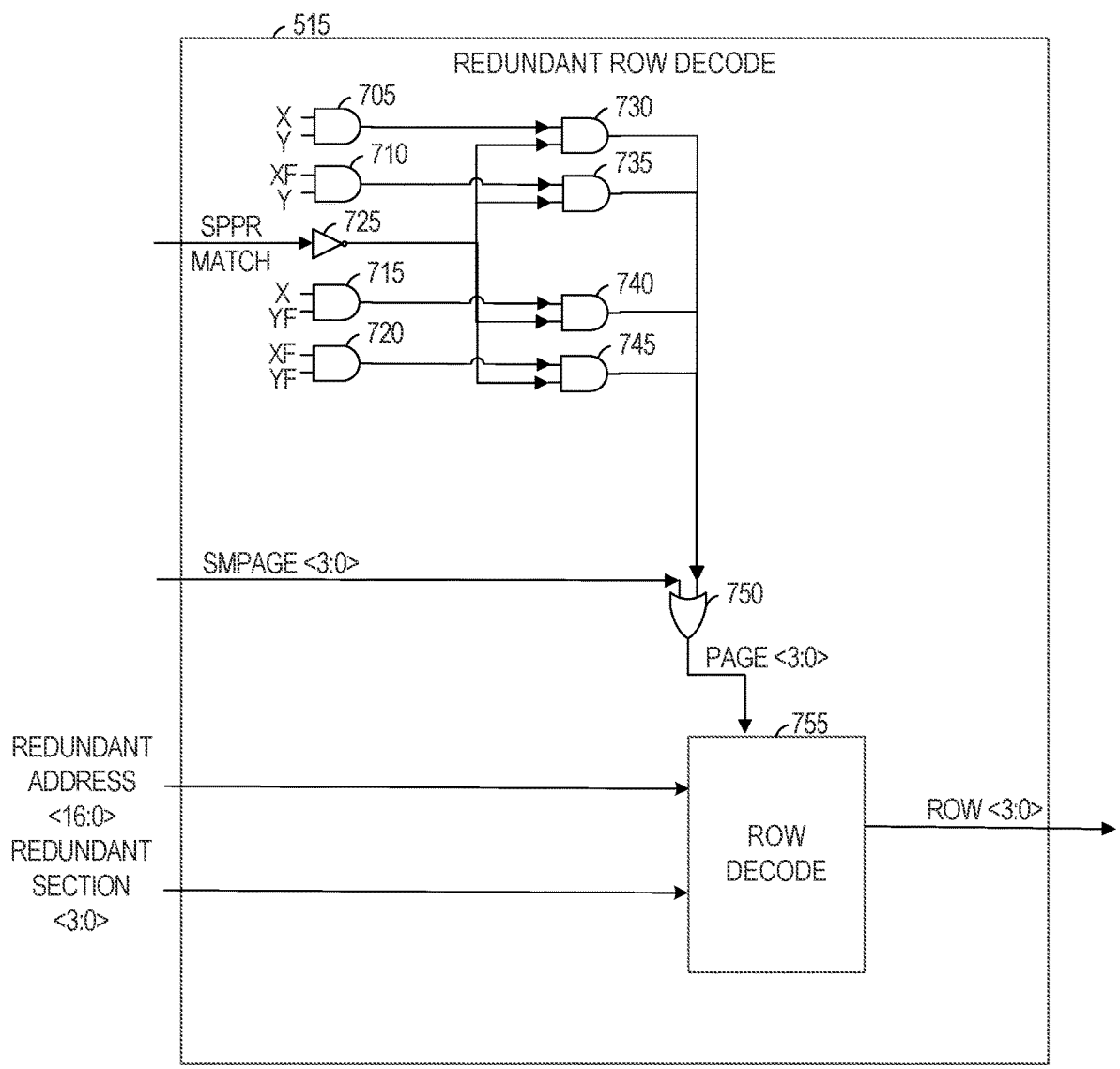
FIG. 7 is a block diagram illustrating a redundant row decode circuit, according to an embodiment.

FIG. 7 is a block diagram illustrating the redundant row decoder 415, according to an embodiment. The redundant row decoder 415 comprises AND gates 705, 710, 715, 720, 730, 735, 740, and 745, NOT gate 725, and OR gate 750. The redundant row decoder 515 receives an SPPR Match signal, an SMPage <3:0> signal, a Redundant Address <16:0> signal, a Redundant Section <3:0> signal, two address bits (X and Y) that determine a page, and the inverse of the two address bits (XF and YF) as inputs. The redundant row decoder 515 generates a Row <3:0> output that indicates the page of the redundant row to be read.

If SPPR Match is set, the output of the NOT gate 725 is cleared and the output of all four AND gates 730-745 is cleared. Then the output of the bitwise OR gate 750 is all zeros, regardless of the value of SMPage <3:0>. As a result, the OR gate 750 ORs the SMPage <3:0> signal with zeros and the Page <3:0> value is the same as the SMPage <3:0> signal. Thus, when the SPPR circuit 410 determines that there is an SPPR Match and identifies the corresponding SMPage<3:0>, the redundant row decoder 415 does not override the determined page based on the redundant address provided by the programmable element bank 126.

If SPPR Match is cleared, the AND gates 705-720 and 730-745 act as a two-bit decoder, causing a different one of the four AND gates 730-745 to have an output value of one for each of the four possible combinations of X and Y. The decoded row is bitwised ORed with the SMPage <3:0> by the OR gate 750 and provided as the Page <3:0> input to the row decoder 755. SMPage <3:0> is all zeros if SPPR Match is cleared, so the Page <3:0> input is just the decoded row.

The row decoder 755 has many outputs, one for each redundant row of the memory array 120. At most one of the outputs is set, indicating that the corresponding row is to be read. The outputs may comprise multiple bits (e.g., one for each page of the corresponding row). For simplicity, only the output corresponding to the selected row is shown in FIG. 7.

The row decoder 755 selects a row based on the Redundant Address <16:0> input and the Redundant Section <3:0> input. The page of the row is selected based on the Page <3:0> input. The output signal for the selected row and page is set and all other outputs are cleared.

Figure 8:
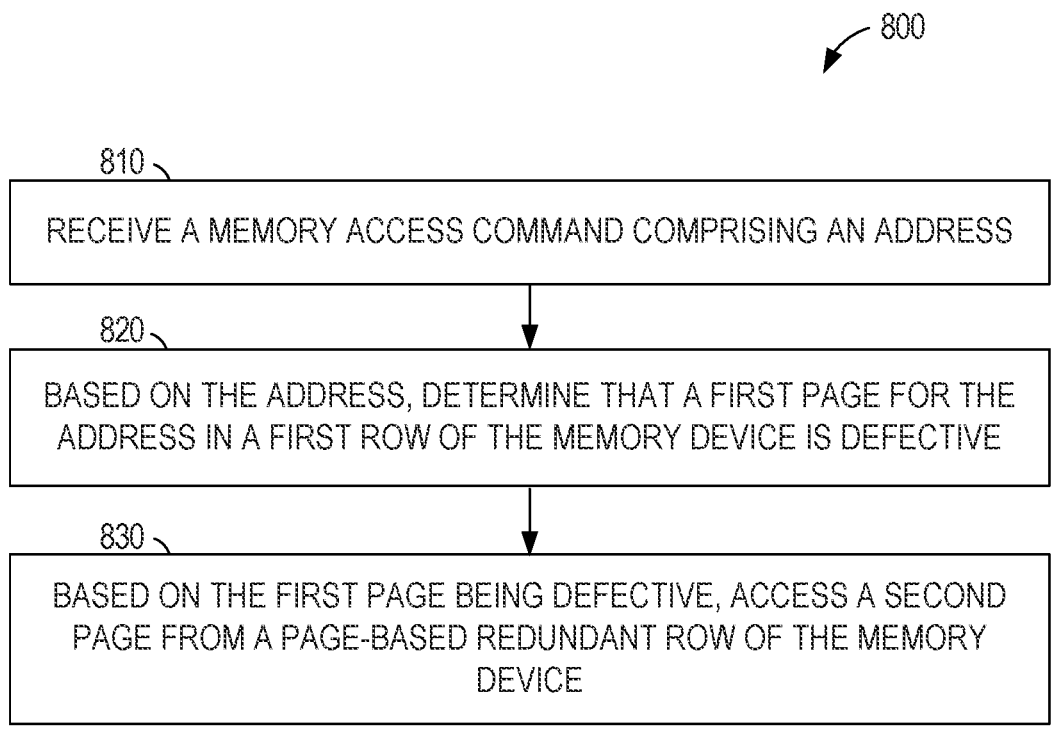
FIG. 8 is a flow chart showing operations of a method performed by a circuit in remapping a memory address, according to an embodiment.

FIG. 8 is a flow chart showing operations of a method 800 performed by a circuit in remapping a memory address, according to an embodiment. The method 800 comprises operations 810, 820, and 830. By way of example and not limitation, the method 800 is described as being performed by the memory device 100 of FIG. 1.

In operation 810, the memory device 100 receives a memory access command comprising an address. For example, a read command may be received along with an address on the Address <N:0> signal of FIG. 1.

The memory device 100, in operation 820, determines, based on the address, that a first page for the address in a first row of the memory device 100 is defective. For example, the storage element 112 may latch the input address and provide it as an input to the programmable element bank 126. Based on the address, the programmable element bank 126 accesses a storage element that indicates whether the address is for a row having one or more defective pages. If one or more pages of the row are defective, the programmable element bank generates an output that indicates this (e.g., the Redundant Match signal of FIG. 1) and an address for a row that is being used in place of the first row (e.g., the Redundant Address <N:0> signal of FIG. 1).

Based on the first page being defective, the memory device 100 accesses a second page from a page-based redundant row of the memory device 100 (operation 830). For example, the redundant row decoder 415 of FIG. 4 may use an output from the SPPR circuit 410 along with the Redundant Address <N:0> signal from the programmable element bank 126 to select a page of a row-based redundant row. The memory device 100 accesses the selected page from the memory array 120 (e.g., one of the page-based redundant rows 128).

The method 800 may be repeated any number of times for different addresses or for the same address at different times. Operation 820 recites determining that a page in a row is defective based on the address. In the alternative, the memory device 100 may, based on the address, determine that the page in the row is not defective. In that case, based on the page of the row not being defective, the memory device 100 accesses a page from the row. For example, the programmable element bank 126 may store addresses for defective rows. If the address received by the memory device is not stored in the programmable element bank 126, the prime row for the address may be accessed.

Figure 9:
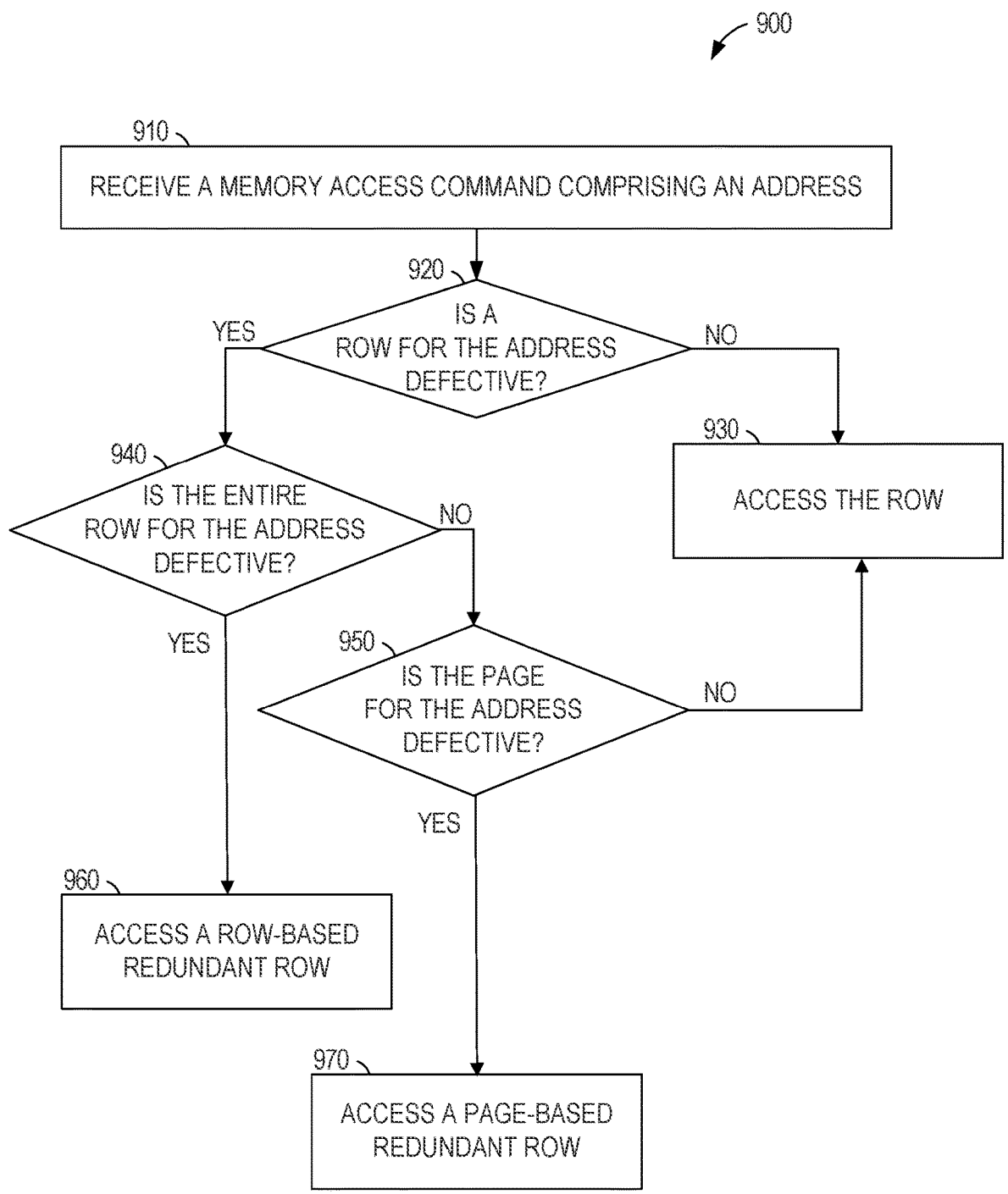
FIG. 9 is a flow chart showing operations of a method performed by a circuit in remapping a memory address, according to an embodiment.

FIG. 9 is a flow chart showing operations of a method 900 performed by a circuit in remapping memory address, according to an embodiment. The method 900 comprises operations 910, 920, 930, 940, 950, 960, and 970. By way of example and not limitation, the method 900 is described as being performed by the memory device 100 of FIG. 1.

In operation 910, the memory device 100 receives a memory access command comprising an address. In operation 920, the memory device 100 determines if a row for the address is defective. For example, the first two bits of the address may identify a section of the memory array 120, the next ten bits of the address may identify a row of the memory array 120 within the section, and the last three bits of the address may identify a page within the row. A lookup table in the programmable element bank 126 may store the section and row portions of addresses for which the corresponding data rows are at least partially defective. Thus, if the received address is stored in the programmable element bank 126, the memory device 100 determines that the row for the address is defective. If the row for the address is not defective, the memory device 100 accesses the row (operation 930).

If the row for the address is determined to be defective in operation 920, the memory device 100 further determines if the entire row for the address is defective or if the row is only partially defective (operation 940). For example, the SPPR Circuit 410 may store the complete addresses for defective pages. If any pages for the row are stored in the SPPR Circuit 410, the row is only partially defective. If the row is fully defective, a row-based redundant row for the address is accessed in operation 960. For example, the address for the row-based redundant row may be stored in the programmable element bank 126 and provided from the programmable element bank 126 to the redundant row decoder 415. The redundant row decoder 415 decodes the address and identifies the corresponding row-based redundant row.

If the row is only partially defective and the page for the address is not defective, the page is accessed from the row for the address (operation 930). Thus, the non-defective portions of a partially defective row remain in use, increasing the lifespan of the memory device 100.

If the row is only partially defective and the page for the address is defective, a page of a page-based redundant row is accessed (operation 970). For example, the SPPR circuit 410 may provide an address to the redundant row decoder 415. The redundant row decoder 415 decodes the address and identifies the corresponding page-based redundant row.

The same page-based redundant row may be used in place of defective pages in different prime rows. Conversely, a single prime row may have multiple pages replaced using the same or different page-based redundant rows.

The method 900 may be used to substitute pages in a page-based redundant row for pages in a row-based redundant row. For example, if an entire prime row is found to be defective, the portion of an address that identifies the row may be stored in the programmable element bank 126 along with an address for a row-based redundant row to be used in substitution for the prime row. At a later time, one of the pages in the row-based redundant row may become defective. Thereafter, the address for the corresponding page in the prime row is stored in the SPPR Circuit 410. As a result, when an incoming memory access command is received that addresses the doubly defective page, the programmable element bank 126 will identify the row-based redundant row that replaces the entire row and the SPPR Circuit 410 will identify the page of the page-based redundant row that replaces the page of the prime row (and of the row-based redundant row). Thus, the redundant row decoder 415 will receive a signal from the programmable element bank 126 to use a row-based redundant row and a signal from the SPPR Circuit 410 to use a page-based redundant row. The signal from the SPPR Circuit 410 overrides the signal from the programmable element bank 126 and the page-based redundant row is accessed.

Figure 10:
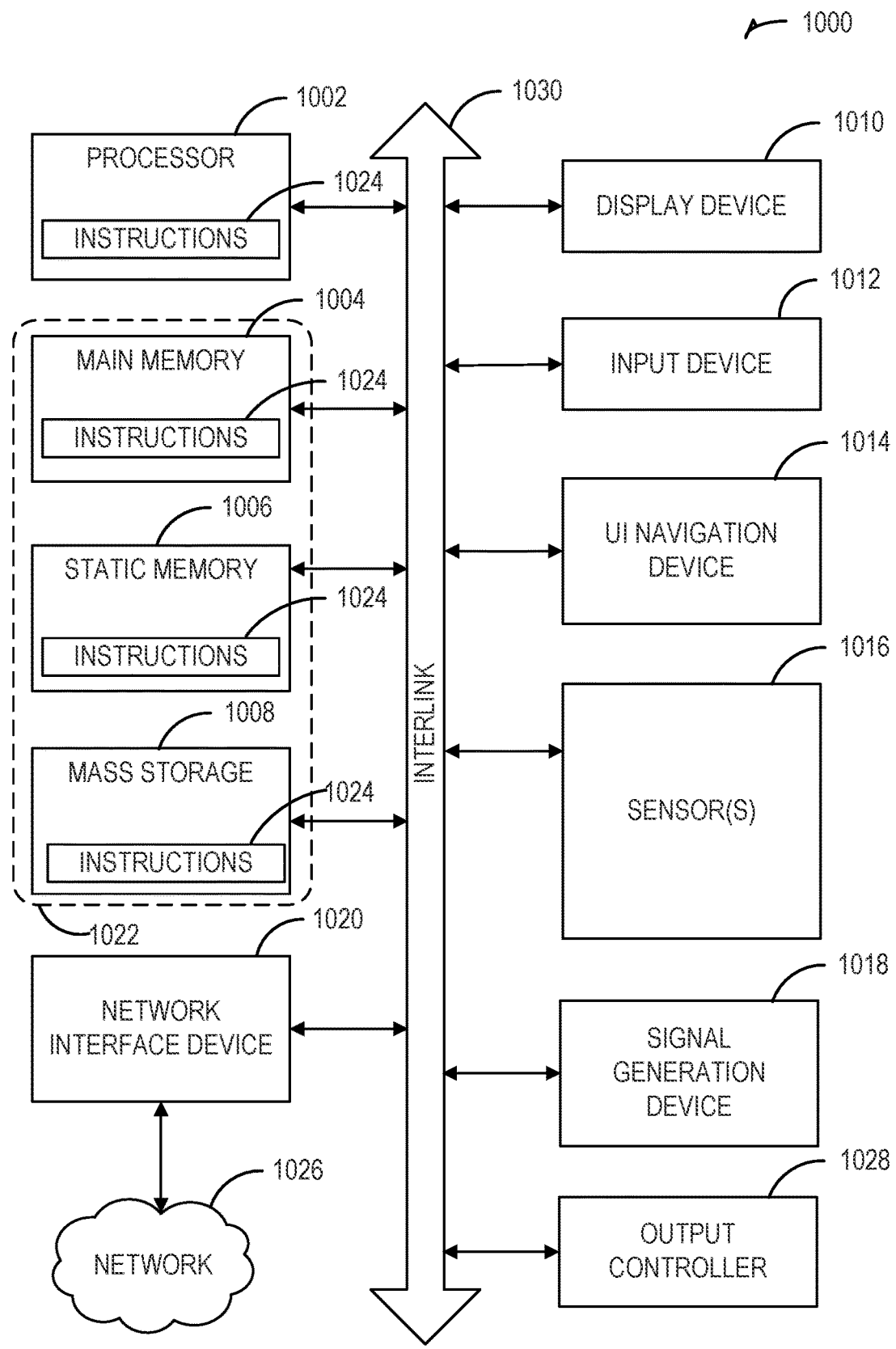
FIG. 10 illustrates a block diagram of an example machine with which, in which, or by which any one or more of the techniques (e.g., methodologies) discussed herein can be implemented.

FIG. 10 illustrates a block diagram of an example machine 1000 with which, in which, or by which any one or more of the techniques (e.g., methodologies) discussed herein can be implemented. Examples, as described herein, can include, or can operate by, logic or a number of components, or mechanisms in the machine 1000. Circuitry (e.g., processing circuitry) is a collection of circuits implemented in tangible entities of the machine 1000 that include hardware (e.g., simple circuits, gates, logic, etc.). Circuitry membership can be flexible over time. Circuitries include members that can, alone or in combination, perform specified operations when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a machine-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine-readable medium elements are part of the circuitry or are communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time. Additional examples of these components with respect to the machine 1000.

In alternative embodiments, the machine 1000 can operate as a standalone device or can be connected (e.g., networked) to other machines. In a networked deployment, the machine 1000 can operate in the capacity of a server machine, a client machine, or both in server-client network environments. In an example, the machine 1000 can act as a peer machine in peer-to-peer (P2P) (or other distributed) network environment. The machine 1000 can be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine 1000 (e.g., computer system) can include a hardware processor 1002 (e.g., a central processing unit (CPU), a graphics processing unit (GPU), a hardware processor core, or any combination thereof), a main memory 1004, a static memory 1006 (e.g., memory or storage for firmware, microcode, a basic-input-output (BIOS), unified extensible firmware interface (UEFI), etc.), and mass storage device 1008 (e.g., hard drives, tape drives, flash storage, or other block devices) some or all of which can communicate with each other via an interlink 1030 (e.g., bus). The machine 1000 can further include a display device 1010, an alphanumeric input device 1012 (e.g., a keyboard), and a user interface (UI) navigation device 1014 (e.g., a mouse). In an example, the display device 1010, the input device 1012, and the UI navigation device 1014 can be a touch screen display. The machine 1000 can additionally include a signal generation device 1018 (e.g., a speaker), a network interface device 1020, and one or more sensor(s) 1016, such as a global positioning system (GPS) sensor, compass, accelerometer, or other sensor. The machine 1000 can include an output controller 1028, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the hardware processor 1002, the main memory 1004, the static memory 1006, or the mass storage device 1008 can be, or include, a machine-readable media 1022 on which is stored one or more sets of data structures or instructions 1024 (e.g., software) embodying or used by any one or more of the techniques or functions described herein. The instructions 1024 can also reside, completely or at least partially, within any of registers of the hardware processor 1002, the main memory 1004, the static memory 1006, or the mass storage device 1008 during execution thereof by the machine 1000. In an example, one or any combination of the hardware processor 1002, the main memory 1004, the static memory 1006, or the mass storage device 1008 can constitute the machine-readable media 1022. While the machine-readable media 1022 is illustrated as a single medium, the term "machine-readable medium" can include a single medium or multiple media (e.g., a centralized or distributed database, or associated caches and servers) configured to store the one or more instructions 1024.

The term "machine readable medium" can include any medium that is capable of storing, encoding, or carrying instructions for execution by the machine 1000 and that cause the machine 1000 to perform any one or more of the techniques of the present disclosure, or that is capable of storing, encoding, or carrying data structures used by or associated with such instructions. Non-limiting machine-readable medium examples can include solid-state memories, optical media, magnetic media, and signals (e.g., radio frequency signals, other photon-based signals, sound signals, etc.). In an example, a non-transitory machine-readable medium comprises a machine-readable medium with a plurality of particles having invariant (e.g., rest) mass, and thus are compositions of matter. Accordingly, non-transitory machine-readable media are machine readable media that do not include transitory propagating signals. Specific examples of non-transitory machine-readable media can include: non-volatile memory, such as semiconductor memory devices (e.g., electrically programmable read-only memory (EPROM), electrically erasable programmable read-only memory (EEPROM)) and flash memory devices; magnetic disks, such as internal hard disks and removable disks; magneto-optical disks; and CD-ROM and DVD-ROM disks.

In an example, information stored or otherwise provided on the machine-readable media 1022 can be representative of the instructions 1024, such as instructions 1024 themselves or a format from which the instructions 1024 can be derived. This format from which the instructions 1024 can be derived can include source code, encoded instructions (e.g., in compressed or encrypted form), packaged instructions (e.g., split into multiple packages), or the like. The information representative of the instructions 1024 in the machine-readable media 1022 can be processed by processing circuitry into the instructions to implement any of the operations discussed herein. For example, deriving the instructions 1024 from the information (e.g., processing by the processing circuitry) can include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 1024.

In an example, the derivation of the instructions 1024 can include assembly, compilation, or interpretation of the information (e.g., by the processing circuitry) to create the instructions 1024 from some intermediate or preprocessed format provided by the machine-readable media 1022. The information, when provided in multiple parts, can be combined, unpacked, and modified to create the instructions 1024. For example, the information can be in multiple compressed source code packages (or object code, or binary executable code, etc.) on one or several remote servers. The source code packages can be encrypted when in transit over a network and decrypted, uncompressed, assembled (e.g., linked) if necessary, compiled or interpreted (e.g., into a library, stand-alone executable etc.) at a local machine, and executed by the local machine.

The instructions 1024 can be further transmitted or received over a communications network 1026 using a transmission medium via the network interface device 1020 utilizing any one of a number of transfer protocols (e.g., frame relay, internet protocol, transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), plain old telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1020 can include one or more physical jacks (e.g., Ethernet, coaxial, or phone jacks) or one or more antennas to connect to the network 1026. In an example, the network interface device 1020 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 1000, and includes digital or analog communications signals or other intangible medium to facilitate communication of such software. A transmission medium is a machine readable medium.

To better illustrate the methods and apparatuses described herein, a non-limiting set of Example embodiments are set forth below as numerically identified Examples.

Example 1 is a memory device comprising: a memory array comprising: a plurality of prime rows, each prime row comprising a first number of pages, the first number being greater than one; and a set of redundant rows, each redundant row comprising the first number of pages; a memory controller configured to: receive a memory access command comprising an address; and based on the address: determine that a first page for the address in a prime row is defective; and access a second page from a redundant row.

In Example 2, the subject matter of Example 1, wherein the memory controller is further configured to: receive a second memory access command comprising a second address; and based on the second address: determine that a third page for the second address in the prime row is not defective; and access the third page from the prime row.

In Example 3, the subject matter of Examples 1-2, wherein the memory controller is further configured to: receive a second memory access command comprising a second address; and based on the second address: determine that a third page for the second address in a second prime row is defective; and access a fourth page from the redundant row.

In Example 4, the subject matter of Examples 1-3, wherein the memory controller is further configured to: receive a second memory access command comprising a second address; and based on the second address: determine that an entire second prime row is being substituted by a second redundant row; determine that a third page in the second redundant row is defective; determine that the third page in the second redundant row is being substituted by a fourth page in a third redundant row; and access the fourth page from the third redundant row.

In Example 5, the subject matter of Example 4 includes a logic circuit configured to assert a match signal when address data to be accessed matches defective address data; wherein the determining that the third page in the second redundant row is defective is based on the match signal being asserted.

In Example 6, the subject matter of Examples 1-5 includes a logic circuit configured to assert a match signal when address data to be accessed matches defective address data; wherein the determining that the first page for the address in the prime row is defective is based on the match signal being asserted.

In Example 7, the subject matter of Examples 1-6, wherein the memory array comprises a hybrid random access memory array.

Example 8 is a method comprising: receiving, by a memory controller, a memory access command comprising an address corresponding to a page of memory, a page being smaller than a row; and based on the address: determining that a first page for the address in a first row of a memory device is defective; and accessing a second page from a redundant row of the memory device.

In Example 9, the subject matter of Example 8 includes receiving a second memory access command comprising a second address; and based on the second address: determining that a third page for the second address in the first row is not defective; and accessing the third page from the first row.

In Example 10, the subject matter of Examples 8-9 includes receiving a second memory access command comprising a second address; and based on the second address: determining that a third page for the second address in a second prime row of the memory device is defective; and accessing a fourth page from the redundant row of the memory device.

In Example 11, the subject matter of Examples 8-10 includes receiving a second memory access command comprising a second address; and based on the second address: determining that an entire second prime row is being substituted by a second redundant row; determining that a third page in the second redundant row is defective; determining that the third page in the second redundant row is being substituted by a fourth page in a third redundant row; and accessing the fourth page from the third redundant row.

In Example 12, the subject matter of Example 11, wherein: the determining that the third page in the second redundant row is defective is based on a match signal being asserted by a logic circuit that is configured to assert the match signal when address data to be accessed matches defective address data.

In Example 13, the subject matter of Examples 8-12, wherein: the determining that the first page for the address in the first row is defective is based on a match signal being asserted by a logic circuit configured to assert the match signal when address data to be accessed matches defective address data.

Example 14 is a method comprising: detecting, after packaging a memory device that comprises a memory array comprising prime rows and redundant rows and non-volatile memory, first defective address data corresponding to a first address of the memory array to be accessed that includes, at least one defective memory cell; and storing, after packaging the memory device, the first defective address data into the non-volatile memory in association with a page of a redundant row, wherein a page is smaller than a row.

In Example 15, the subject matter of Example 14 includes detecting, before packaging the memory device, second defective address data corresponding to a second address of the memory array to be accessed that includes at least one defective memory cell; and storing, before packaging the memory device, the second defective address data into the non-volatile memory in association with an entire second redundant row.

In Example 16, the subject matter of Example 15, wherein the storing of the second defective address data in association with the second redundant row is based on the detecting of the second address being defective before the packaging of the memory device.

In Example 17, the subject matter of Examples 14-16, wherein the storing of the first defective address data in association with the redundant row is based on the detecting of the first address being defective after the packaging of the memory device.

In Example 18, the subject matter of Examples 14-17 includes receiving, by a memory controller of the memory device, a memory access command corresponding to the first address; based on the stored first defective address data: determining that a first page for the first address in a prime row of the memory device is defective; and accessing a second page from the redundant row of the memory device.

In Example 19, the subject matter of Example 18 includes receiving a second memory access command comprising a second address; determining that a third page for the second address in the prime row is not defective; and accessing the third page from the prime row.

In Example 20, the subject matter of Examples 18-19 includes determining that the first page for the first address in the prime row is defective based on a match signal being asserted by a logic circuit configured to assert the match signal when address data to be accessed matches defective address data.

Example 21 is at least one machine-readable medium including instructions that, when executed by processing circuitry, cause the processing circuitry to perform operations to implement any of Examples 1-20.

Example 22 is an apparatus comprising means to implement any of Examples 1-20.

Example 23 is a system to implement any of Examples 1-20.

Example 24 is a method to implement any of Examples 1-20.

The above detailed description includes references to the accompanying drawings, which form a part of the detailed description. The drawings show, by way of illustration, specific embodiments in which the inventive subject matter can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" can include "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," and the like are used merely as labels, and are not intended to impose numerical requirements on their objects.

The above description is intended to be illustrative, and not restrictive. For example, the above-described examples (or one or more aspects thereof) can be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the inventive subject matter should be determined with reference to the appended claims, along with the full scope of equivalents to which such claims are entitled.

What is claimed is:

1. A memory device comprising:
   a memory array comprising:
      a plurality of prime rows, each prime row comprising a first number of pages, the first number being greater than one; and
      a set of redundant rows, each redundant row comprising the first number of pages;
   a memory controller configured to:
      receive a first memory access command comprising a first address;
      based on the first address:
         determine that a first page for the first address in a prime row is defective; and
         access a second page from a redundant row;
      receive a second memory access command comprising a second address; and
      based on the second address:
         determine that a third page for the second address in the prime row is not defective; and
         access the third page from the prime row.

2. The memory device of claim 1, wherein the memory controller is further configured to:
   receive a third memory access command comprising a third address; and
   based on the third address:
      determine that a fourth page for the third address in a second prime row is defective; and
      access a fifth page from the redundant row.

3. The memory device of claim 1, wherein the memory controller is further configured to:
   receive a third memory access command comprising a third address; and
   based on the third address:
      determine that an entire second prime row is being substituted by a second redundant row;
      determine that a fourth page in the second redundant row is defective;
      determine that the fourth page in the second redundant row is being substituted by a fifth page in a third redundant row; and
      access the fifth page from the third redundant row.

4. The memory device of claim 3, further comprising:
a logic circuit configured to assert a match signal when address data to be accessed matches defective address data;
wherein the determining that the fourth page in the second redundant row is defective is based on the match signal being asserted.

5. The memory device of claim 1, further comprising:
a logic circuit configured to assert a match signal when address data to be accessed matches defective address data;
wherein the determining that the first page for the first address in the prime row is defective is based on the match signal being asserted.

6. The memory device of claim 1, wherein the memory array comprises a hybrid random access memory array.

7. A method comprising:
receiving, by a memory controller, a first memory access command comprising a first address corresponding to a page of memory, a page being smaller than a row; and
based on the first address:
determining that a first page for the first address in a first row of a memory device is defective; and
accessing a second page from a redundant row of the memory device;
receiving, by the memory controller, a second memory access command comprising a second address;
based on the second address:
determining that a third page for the second address in the first row is not defective; and
accessing the third page from the first row.

8. The method of claim 7, further comprising:
receiving a third memory access command comprising a third address; and
based on the third address:
determining that a fourth page for the third address in a second row of the memory device is defective; and
accessing a fifth page from the redundant row of the memory device.

9. The method of claim 7, further comprising:
receiving a third memory access command comprising a third address; and
based on the third address:
determining that an entire second prime row is being substituted by a second redundant row;
determining that a fourth page in the second redundant row is defective;
determining that the fourth page in the second redundant row is being substituted by a fifth page in a third redundant row; and
accessing the fifth page from the third redundant row.

10. The method of claim 9, wherein:
the determining that the fourth page in the second redundant row is defective is based on a match signal being asserted by a logic circuit that is configured to assert the match signal when address data to be accessed matches defective address data.

11. The method of claim 7, wherein:
the determining that the first page for the first address in the first row is defective is based on a match signal being asserted by a logic circuit configured to assert the match signal when address data to be accessed matches defective address data.

12. A method comprising:
detecting, after packaging a memory device that comprises a memory array comprising prime rows and redundant rows and non-volatile memory, first defective address data corresponding to a first address of the memory array to be accessed that includes at least one defective memory cell; and
storing, after packaging the memory device, the first defective address data into the non-volatile memory in association with a page of a redundant row, wherein a page is smaller than a row.

13. The method of claim 12, further comprising:
detecting, before packaging the memory device, second defective address data corresponding to a second address of the memory array to be accessed that includes at least one defective memory cell; and
storing, before packaging the memory device, the second defective address data into the non-volatile memory in association with an entire second redundant row.

14. The method of claim 13, wherein the storing of the second defective address data in association with the entire second redundant row is based on the detecting of the second address being defective before the packaging of the memory device rather than after the packaging of the memory device.

15. The method of claim 12, wherein the storing of the first defective address data in association with the page of the redundant row is based on the detecting of the first address being defective after the packaging of the memory device rather than before the packaging of the memory device.

16. The method of claim 12, further comprising:
receiving, by a memory controller of the memory device, a memory access command corresponding to the first address;
based on the stored first defective address data:
determining that a first page for the first address in a prime row of the memory device is defective; and
accessing a second page from the redundant row of the memory device.

17. The method of claim 16, further comprising:
receiving a second memory access command comprising a second address;
determining that a third page for the second address in the prime row is not defective; and
accessing the third page from the prime row.

18. The method of claim 16, further comprising:
determining that the first page for the first address in the prime row is defective based on a match signal being asserted by a logic circuit configured to assert the match signal when address data to be accessed matches defective address data.

19. The memory device of claim 1, wherein the set of redundant rows comprises a first redundant row that is allocated as a row-based redundant row and a second redundant row that is allocated as a page-based redundant row.

20. The method of claim 12, wherein the redundant row is a page-based redundant row, and the memory device further comprises a row-based redundant row.

* * * * *